United States Patent
Ng et al.

(10) Patent No.: US 10,236,063 B2
(45) Date of Patent: *Mar. 19, 2019

(54) SPLIT MEMORY BANK

(71) Applicant: HEWLETT-PACKARD DEVELOPMENT COMPANY, L.P., Houston, TX (US)

(72) Inventors: Boon Bing Ng, Vancouver, WA (US); Thida Ma Win, Singapore (SG); Ning Ge, Palo Alto, CA (US); Jose Jehrome Rando, Salisbury Downs (AU)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/986,531

(22) Filed: May 22, 2018

(65) Prior Publication Data

US 2018/0268905 A1 Sep. 20, 2018

Related U.S. Application Data

(63) Continuation of application No. 15/327,927, filed as application No. PCT/US2014/048873 on Jul. 30, 2014, now Pat. No. 10,014,055.

(51) Int. Cl.
| | |
|---|---|
| *G11C 16/06* | (2006.01) |
| *G11C 8/12* | (2006.01) |
| *G11C 16/08* | (2006.01) |
| *B41J 2/175* | (2006.01) |
| *G11C 19/28* | (2006.01) |

(Continued)

(52) U.S. Cl.
CPC ............ *G11C 16/06* (2013.01); *B41J 2/17546* (2013.01); *G11C 8/12* (2013.01); *G11C 16/08* (2013.01); *G11C 19/28* (2013.01); *G11C 19/00* (2013.01)

(58) Field of Classification Search
CPC ......... G11C 16/06; G11C 16/08; G11C 19/28; G11C 16/02; G11C 16/14
See application file for complete search history.

(56) References Cited

U.S. PATENT DOCUMENTS

| | | |
|---|---|---|
| 3,895,360 A | 7/1975 | Cricchi |
| 4,800,530 A | 1/1989 | Itoh et al. |

(Continued)

FOREIGN PATENT DOCUMENTS

| | | |
|---|---|---|
| EP | 0534803 A2 | 3/1993 |
| TW | 200839769 A | 10/2008 |

OTHER PUBLICATIONS

Microchip Technology Inc.; "High-performance Digital Signal Controller"; Feb. 21, 2006 (NOTE: uploaded to USPTO in 8 parts).

*Primary Examiner* — Hien N Nguyen
(74) *Attorney, Agent, or Firm* — Fabian VanCott (US LC)—USD

(57) ABSTRACT

A split memory bank may comprise a number of memory matrices forming a memory bank and a shift register in which the shift register physically separates the matrices. An integrated circuit may comprise a number of shift registers and a plurality of memory matrices forming a memory bank in which the matrices are spatially separated by the shift register. An integrated printhead may comprise a number of memory banks each comprising a plurality of memory matrices and a number of shift registers in which each shift register spatially separates a number of the matrices.

20 Claims, 3 Drawing Sheets

(51) Int. Cl.
*G11C 16/14* (2006.01)
*G11C 19/00* (2006.01)

(56) References Cited

U.S. PATENT DOCUMENTS

| | | |
|---|---|---|
| 5,473,758 A | 12/1995 | Allen et al. |
| 5,920,898 A | 7/1999 | Bolyn et al. |
| 6,160,734 A | 12/2000 | Henderson et al. |
| 6,278,644 B1 | 8/2001 | Takasugi |
| 6,532,556 B1 | 3/2003 | Wong et al. |
| 6,891,774 B1 | 5/2005 | Abdollahi-Alibeik |
| 8,576,641 B1 | 11/2013 | Trimberger |
| 9,007,110 B1 | 4/2015 | Gaide |
| 10,014,055 B2 * | 7/2018 | Ng .................. G11C 16/06 |
| 2008/0158956 A1 | 7/2008 | Im |
| 2008/0266955 A1 | 10/2008 | Plants |
| 2013/0044543 A1 | 2/2013 | Kim |
| 2016/0332439 A1 | 11/2016 | Ge et al. |

* cited by examiner

US 10,236,063 B2

SPLIT MEMORY BANK

BACKGROUND

Erasable Programmable Read-Only memory (EPROM) is used in a number of environments to maintain memory even when power is not provided to the memory. In integrated printhead (IPH) cartridges, an EPROM is placed on or in a printhead die. As storage requirements increase, area occupied by the EPROM or memory bits also increases.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
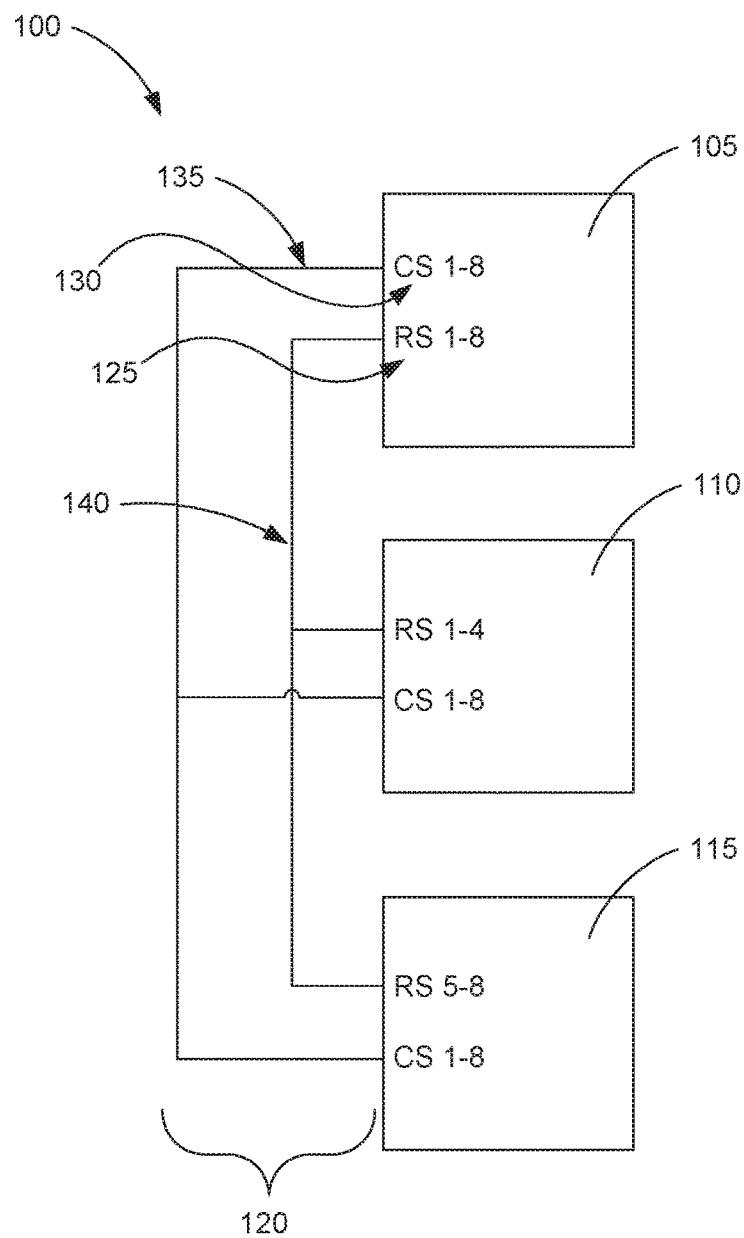
FIG. 1 is a diagram of an EPROM bank design for storing and maintaining data on an integrated printhead.

As mentioned above, as the amount of memory bits used to store data on an integrated printhead (IPH) increases, so does the footprint or Si real estate. It has been determined that historically the memory bits used to store data on an IPH doubles around every year or two. An EPROM is generally made up of a 64-bit EPROM bank with, for example, the bank being divided among 2 EPROM 4×8 matrices. A shift register may also be provided to shift, by one position, the bit array stored in it. Electrical connections between the individual EPROM matrices and the shift register add to the footprint of the EPROM bank as a whole.

The present specification describes a split memory bank comprising a number of memory matrices forming a memory bank and a shift register in which the shift register physically separates the matrices. In one example, the memory may be an EPROM such that a split EPROM bank comprises two EPROM matrices physically separated by a shift register.

The present specification further describes an integrated circuit comprising a number of shift registers and a plurality of memory matrices forming a memory bank in which the matrices are spatially separated by the shift register. In one example, the memory may be EPROM such that the integrated circuit comprises a number of shift registers and a plurality of EPROM matrices forming an EPROM bank, in which the EPROM matrices are spatially separated by the shift register.

Still further, the present specification describes an integrated printhead comprising a number of memory banks each comprising a plurality of memory matrices and a number of shift registers in which each shift register spatially separates a number of the matrices, In one example, the memory may be EPROM such that an integrated printhead comprising a number EPROM banks each comprising a plurality of EPROM matrices, and a number of shift registers, in which each shift register spatially separates a number of the EPROM matrices.

As used in the present specification and in the appended claims, the term "erasable programmable read-only memory (EPROM)" is meant to be understood broadly as any programmable read-only memory that may be retains its data when its power supply is switched off. In one example, the EPROM may be an erasable programmable read-only memory, an electrically erasable programmable read-only memory, or any other type of non-volatile memory that is electrically programmable.

Additionally, as used in the present specification and in the appended claims, the term "matrix" is meant to be understood broadly as any array of elements arranged in rows and columns that can store data. In one example, the array of elements in the matrix may be a 4×8 arrangement with 4 rows and 8 columns. In another example, the matrix is an EPROM matrix.

Further, as used in the present specification and in the appended claims, the term "memory bank" is meant to be understood broadly as any combination of a number of memory matrices. In one example, a memory bank comprises two 4×8 memory matrices. In another example, the memory matrices that make up the memory bank are EPROM matrices.

Even still further, as used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

An EPROM device on an integrated printhead (IPH) may comprise those elements show in FIG. 1. FIG. 1 is a diagram of an EPROM bank design (100) for storing and maintaining data on an integrated printhead. The EPROM design shown in FIG. 1 comprises at least two EPROM matrices (110, 115) and a multiplexing signal generator made of shift registers (105). The EPROM design (100) further comprises a number of lines (120) electrically connecting the EPROM matrices (110, 115) and a shift register (105) together. Although the memory bank design shown in FIG. 1 is described as an EPROM memory bank (100), the memory bank may be any type of memory storage as defined in the present description and is not necessarily limited to EPROM technology. EPROM memory bank being only one example, for convenience, the present description will use an EPROM memory bank as merely an example and is not meant to limit the description in any way.

In order to write and read from a specific EPROM matrix (110, 115), the shift register (105) selects a certain row select (125) and a certain column select (130) on one of the two EPROM matrices (110, 115). In the example show in FIG. 1, the shift register connects to each of the EPROM matrices (110, 115) using two sets (135, 140) of 8 lines from among the number of lines (120); a first set (135) as output from the column select (130) on the shift register (105) and the other set (140) as output from the row select (125) on the shift register (105). These lines separate to connect to the inputs of the individual EPROM matrices (110, 115). The different EPROM matrices (110, 115) of FIG. 1 are accessed via this cascade method where the shift register (105) sends all electrical lines down to the EPROM matrices (110, 115) with the electrical lines cascading away from the group of lines when they are to connect with an input of one of the EPROM matrices (110, 115). This design has all electrical lines emanating from the shift register (105) thereby occupying the maximum amount of space next to the EPROM bank design (100) as possible with electrical lines.

Figure 2:
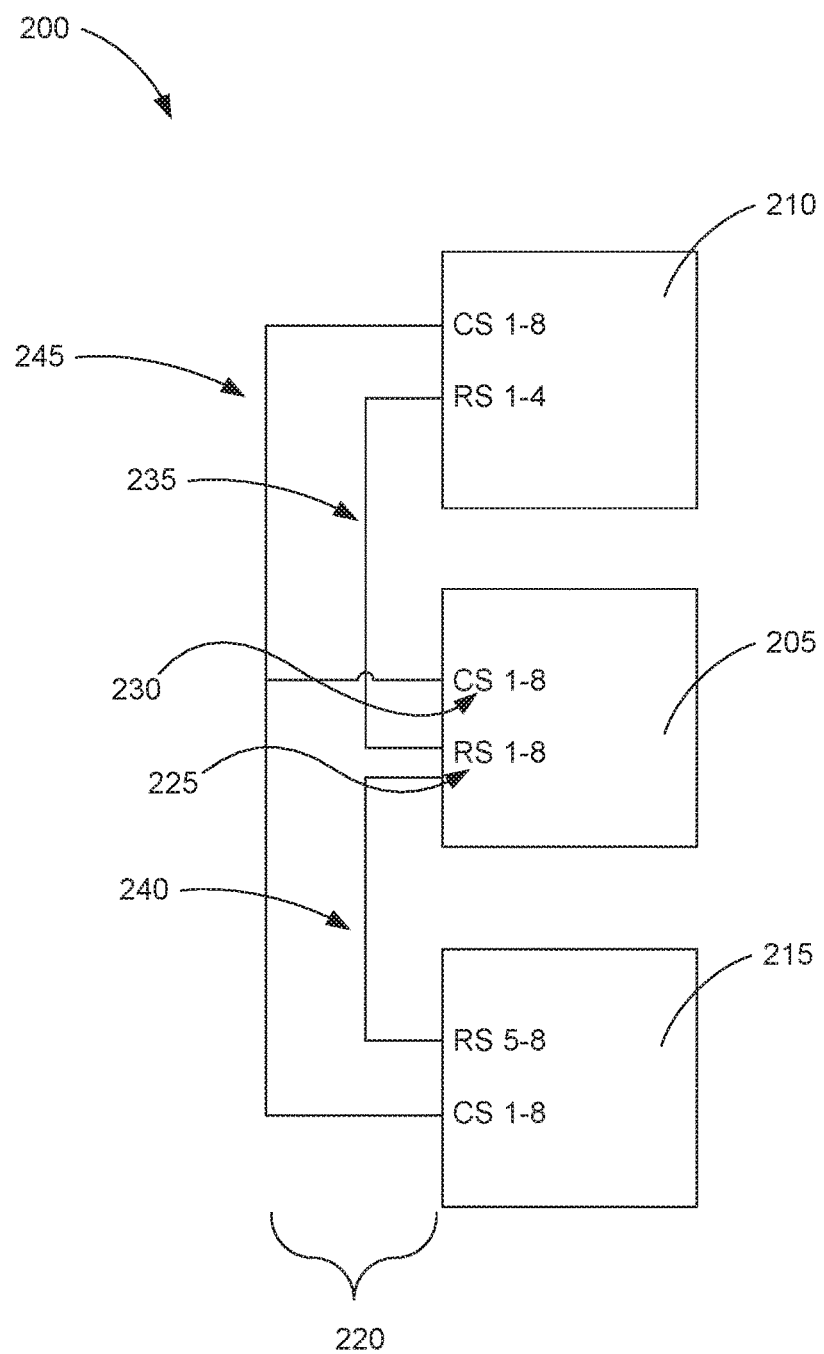
FIG. 2 is a diagram of an EPROM bank design for storing and maintaining data on an integrated printhead according to one example of the principles described herein.

FIG. 2 is a diagram of an EPROM bank design (200) for storing and maintaining data on an integrated printhead according to one example of the principles described herein. The EPROM design (200) comprises a shift register based multiplexing signal generator (205) physically separating two EPROM matrices (210, 215). In one example, the EPROM bank comprises two 4×8 EPROM matrices. In this example, the EPROM bank is a 64-bit EPROM bank: two 32 bit EPROM matrices (210, 215). In one example, the EPROM design (200) comprises as single shift register (205).

Although, FIG. 2 shows an EPROM design (200) with an EPROM bank comprising two 4×8 EPROM matrices (210, 215) and a single shift register (205), other configurations may exist. In one example, the EPROM matrices (210, 215) may contain smaller or larger quantities of bits such that the number of rows and columns are reduced or increased beyond the 4×8 example provided herein. Additional shift registers (205) and EPROM matrices may also be added to the EPROM design (200). In one example, a number of EPROM banks designs (200) depicted in FIG. 2 may be communicatively coupled to each other and placed on an integrated printhead (IPH). The design (200) depicted in FIG. 2, therefore, is merely an example and other examples may exist without going beyond the principles described herein.

The placement of the shift register (205) between a first EPROM matrix (210) and a second EPROM matrix (215) provides for a number of advantages, Such a placement of the shift register (205) between a first EPROM matrix (210) and a second EPROM matrix (215) provides for less area displaced on the SI chip. Specifically, unlike FIG. 1, the connecting electrical lines between the shift register (205) and the EPROM matrices (210, 215) amounts to a 12 line depth from the outputs and inputs of the devices. Specifically, the shift register (205) has two separate outputs (235, 240) from the row select (225) with both outputs (235, 240) comprising 4 lines. However, these two sets of 4 lines run in opposite directions and run parallel to the shift register (205) and EPROM matrices (210, 215) such that the two sets of four lines take up the same amount of space and lie the same distance from those devices. Additionally, the column select output (230) comprises eight lines (245) that bifurcate into two sets of eight lines that run parallel to the output lines (235, 240) and connect with the EPROM matrices (210, 215). This results in a total line depth of 12 lines from the shift register (205) and EPROM matrices (210, 215).

Compared to FIG. 1, this is a 25% reduction in routing lines and consequently a 14% reduction in the width of the EPROM bank. This reduces the amount of footprint in the EPROM bank design and allows smaller designs of devices incorporating this EPROM bank such as an integrated printhead. This may further allow for devices that incorporate larger numbers of EPROM banks as described in FIG. 2. For example, where a plurality of EPROM banks as described in FIG. 2 are connected, the footprint reduction of the entire group of EPROM banks allows for an additional number of EPROM banks to be added to the group without increasing the original footprint occupied by other designs such as that depicted in FIG. 1. Consequently, larger amounts of memory bits may be placed on a device such as an integrated printhead and larger amounts of data may be stored thereon. Additional data may provide for the ability to store various other types of data that may be used to provide additional features and benefits for the integrated printhead and printer.

Figure 3:
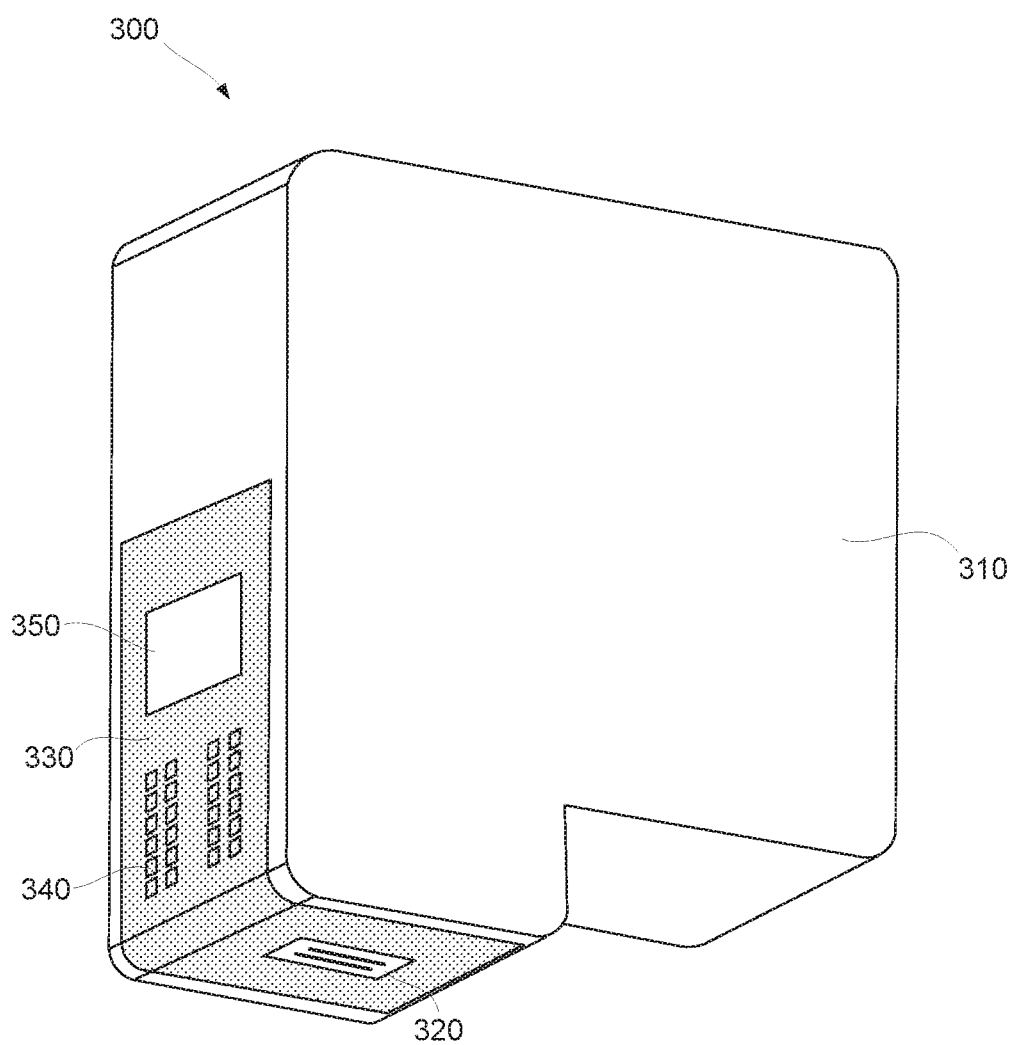
FIG. 3 is a perspective view of an integrated print cartridge incorporating an integrated print head and EPROM bank of FIG. 2 according to one example of the principles described herein.

FIG. 3, is a perspective view of an integrated print cartridge (300) incorporating an integrated print head and EPROM bank of FIG. 2 according to one example of the principles described herein. The integrated print cartridge (300) is more generally a fluid-jet precision-dispensing device or fluid ejector structure that precisely dispenses fluid, such as ink. In one example, the integrated print cartridge (300) illustrated in FIG. 3 may be a single color ink cartridge for a fluid-jet printer. However, according to the principles described herein, the integrated print cartridge (300) may be implemented in any of a variety of fluid cartridges or printheads with an on-board memory.

While the present description describes generally an inkjet-printing cartridge that ejects ink onto media, examples of the present specification may not be limited to only inkjet printing cartridges and associated devices. In general, examples of the present specification pertain to any type of fluid-jet precision-dispensing or ejection devices that dispense a fluid. In the present specification and in the appended claims, the term fluid is meant to be broadly interpreted as any substance that deforms under an applied force. Examples of fluids, therefore, comprise liquids and gases. A fluid-jet precision-dispensing device is a device in which printing, or dispensing, of the fluid in question is achieved by precisely printing or dispensing in accurately specified locations, with or without making a particular image on that which is being printed or dispensed on. Thus, for purposes of explanation, a print cartridge or ink cartridge will be described. However, it will be understood that any type of fluid or liquid cartridge may be used with the principles described herein.

According to one example, the integrated print cartridge (300) is comprised of an ink reservoir (310), a fluid-jet die (320), a flexible cable (330), conductive pads (340), and an integrated circuit (350). The flexible cable (330) is adhered to two sides of the print cartridge (300) and contains traces that electrically connect the integrated circuit (350) and fluid-jet die (320) with the conductive pads (340).

The integrated print cartridge (300) is installed into a cradle that is integral to the carriage of a printer. When the integrated print cartridge (300) is correctly installed, the conductive pads (340) are pressed against corresponding electrical contacts in the cradle, allowing the printer to communicate with, and control the electrical functions of, the integrated print cartridge (300). For example, the conductive pads (340) allow the printer to access and write to the integrated circuit (350).

The integrated circuit (350) comprises at least one EPROM bank (FIG. 2, 200) as described in FIG. 2 that contains a variety of information including the type of ink cartridge, the kind of ink contained in the cartridge, an estimate of the amount of ink remaining in the ink reservoir (310), calibration data, error information, the identification of the integrated printhead, an analog serial number, and security features such as cyclic redundant check (CRC), among others. The printer can take appropriate action based on the information contained in the ink integrated circuit (350), such as notifying the user that the ink supply is low or altering printing routines to maintain image quality. In the illustrated example, the integrated circuit (350) is shown as a separate element that is distinct from the ink jet die (320). However, according to one example, the ink jet die (320) may contain the memory in addition to the physical elements used to dispense the ink.

To create an image, the printer moves the carriage containing the ink cartridge over a piece of print medium. At appropriate times, the printer sends electrical signals to the integrated print cartridge (300) via the electrical contacts in the cradle. The electrical signals pass through the conductive pads (340) and are routed through the flexible cable (330) to the fluid-jet die (320). The fluid-jet die (320) then ejects a small droplet of ink from the reservoir (310) onto the surface of the print medium. These droplets combine to form an image on the print medium surface.

The specification and figures describe a split memory bank comprising a shift register interposed between a number of memory matrices. The separation of, for example, two memory matrices to which the shift register is communicatively coupled to allows for a smaller footprint for the split memory bank as described above. This may also reduce the amount of materials used to form the split memory bank as well as reduce the total size of a computing device or other element incorporating the split memory bank described herein.

The preceding description has been presented to illustrate and describe examples of the principles described. This description is not intended to be exhaustive or to limit these principles to any precise form disclosed. Many modifications and variations are possible in light of the above teaching.

What is claimed is:

1. A split memory bank comprising:
   a number of memory matrices forming a memory bank; and
   a shift register based multiplexing signal generator;
   in which the shift register based multiplexing signal generator physically separates the matrices; and
   in which the shift register based multiplexing signal generator comprises a group of 8 electrical connection outputs from a row select and in which that group of 8 electrical connection outputs branch out into two groups of 4 electrical connections.

2. The split memory bank of claim 1, in which the memory is an EPROM.

3. The split memory bank of claim 1, in which the matrices each comprises multiple rows and a double amount of columns to rows.

4. The split memory bank of claim 1, in which the split memory bank is electrically coupled to a number of memory banks.

5. The split memory bank of claim 1, in which the shift register based multiplexing signal generator comprises a single group of 8 electrical connection outputs from a column select and in which that single group of 8 electrical connection outputs branch out into two groups of 8 electrical connections running perpendicular to the single group of 8 electrical connection outputs and connecting to corresponding column select inputs on the number of matrices.

6. The split memory bank of claim 1, in which the two groups of 4 electrical connections run perpendicular to the group of 8 electrical connection outputs and electrically couple to corresponding row select inputs on the number of matrices.

7. The split memory bank of claim 1, in which the group of 8 electrical connection outputs are formed into two groups of 4 electrical connection outputs from the row select and in which those groups of 4 electrical connection outputs connect to corresponding row select inputs on the number of matrices.

8. An integrated circuit comprising:
   a number of shift registers; and
   a plurality of memory matrices forming a memory bank;
   in which the matrices are spatially separated by the shift register; and
   in which each shift register comprises a single group of 8 electrical connection outputs from a row select and in which that single group of 8 electrical connection outputs branch out into two groups of 4 electrical connections and connect to corresponding row select inputs on each matrix.

9. The integrated circuit of claim 8, in which the memory is EPROM.

10. The integrated circuit of claim 8, in which the matrices each comprise a number of rows and double the number of columns to rows.

11. The integrated circuit of claim 8, in which the two groups of 4 electrical connections run perpendicular to the single group of 8 electrical connection outputs and connect to corresponding row select inputs on each matrix.

12. The integrated circuit of claim 8, in which the two groups of 4 electrical connections run in opposite directions to their respective inputs on each matrix and in which a combination of each of the 4 electrical connections run parallel to an 8 electrical connection output from a column select of the shift register based multiplexing signal generator.

13. An integrated printhead comprising:
    a number of memory banks each comprising a plurality of memory matrices; and
    a number of shift registers;
    in which each shift register spatially separates a number of the matrices; and
    in which the shift register comprises two separate row select outputs, each connected to a different memory matrix of the memory bank.

14. The integrated printhead of claim 13, in which the memory is EPROM.

15. The integrated printhead of claim 13, in which the shift register comprises a column select output, with a plurality of lines connecting the column select output with each of two different memory matrices of the memory bank.

16. The split memory bank of claim 1, wherein the shift register based multiplexing signal generator comprises one column select output, with a plurality of lines connected to the one column select output bifurcating to run in opposite directions to connect, respectively, with each of two different memory matrices of the memory bank.

17. The split memory bank of claim 1, wherein the shift register based multiplexing signal generator comprises two separate row select outputs divided among the group of 8 electrical connection outputs, with a plurality of lines running from each row select output to a different one of the memory matrices.

18. The split memory bank of claim 17, wherein the shift register based multiplexing signal generator comprises one column select output, with a plurality of lines connected to the one column select output bifurcating to run in opposite directions to connect, respectively, with each of two different memory matrices of the memory bank, the lines from the column select output being parallel with the lines from the row select output.

19. The split memory bank of claim 17, wherein the shift register based multiplexing signal generator comprises one column select output, with a plurality of lines connecting the one column select with each of two different memory matrices of the memory bank, there being no more than 12 lines between the shift register based multiplexing signal generator and each of the memory matrices.

20. The integrated circuit of claim 8, wherein one of the number of shift registers comprises:
- one column select output, with a plurality of lines connecting the one column select with each of two different memory matrices of the memory bank,
- two separate row select outputs, each connected to a different memory matrix of the memory bank.

* * * * *